United States Patent [19]
Jang

[11] Patent Number: 5,654,212
[45] Date of Patent: Aug. 5, 1997

[54] METHOD FOR MAKING A VARIABLE LENGTH LDD SPACER STRUCTURE

[75] Inventor: Wen-Yueh Jang, Hsinchu, Taiwan

[73] Assignee: Winbond Electronics Corp., Hsinchu, Taiwan

[21] Appl. No.: 497,180

[22] Filed: Jun. 30, 1995

[51] Int. Cl.$^6$ .............................. H01L 21/8238

[52] U.S. Cl. .............................. 438/231; 438/304

[58] Field of Search .............................. 437/44, 40 SW, 437/41 SW, 41 RLD, 913, 34, 56, 57, 58; 148/DIG. 112, DIG. 114

[56] References Cited

U.S. PATENT DOCUMENTS

| | | | |
|---|---|---|---|
| 4,574,467 | 3/1986 | Halfacre et al. | 437/34 |
| 4,925,807 | 5/1990 | Yoshikawa | 437/44 |
| 5,134,085 | 7/1992 | Gilgen et al. | 437/52 |
| 5,254,866 | 10/1993 | Ogoh | 257/369 |
| 5,270,233 | 12/1993 | Hamatake | 437/44 |
| 5,278,441 | 1/1994 | Kang et al. | 257/371 |
| 5,358,879 | 10/1994 | Brady et al. | 437/44 |

FOREIGN PATENT DOCUMENTS

| | | | |
|---|---|---|---|
| 63-122174 | 5/1988 | Japan | 437/225 |

Primary Examiner—Charles L. Bowers, Jr.
Assistant Examiner—Michael Trinh
Attorney, Agent, or Firm—Meltzer, Lippe, Goldstein, Wolf & Schlissel, P.C.

[57] ABSTRACT

A method for making a variable length LDD spacer structure is disclosed. A first insulation layer (i.e., gate oxide) is formed on a semiconductor device having a P-well and an N-well provided in a substrate. A first and a second polysilicon gate are formed on the P-well and the N-well respectively wherein the first insulation layer is interposed between the wells and the gates. A second insulation layer is formed over the first and second gates. N-type impurity ions are selectively implanted to form lightly doped N-type diffusion regions in the P-well. Similarly, P-type impurity ions are selectively implanted to form lightly doped P-type diffusion regions in the N-well. A polysilicon spacer is formed on both side walls of each of the gates. Each spacer covers a portion of the lightly doped N-type and P-type diffusion regions. N-type impurity ions are selectively implanted in a portion of the lightly doped N-type diffusion regions not covered by the spacers. This forms N-type source and drain regions in the P-well adjacent to the lightly doped N-type diffusion regions which have a final length equaling the length of the spacers. Next, the spacers are oxidized or nitridized which enlarges the spacers. P-type impurity ions are selectively implanted in a portion of the lightly doped P-type diffusion regions not covered by the enlarged spacers. This forms P-type source and drain regions in the N-well adjacent to the lightly doped P-type diffusion regions which have a final length equaling the length of the enlarged spacers.

11 Claims, 10 Drawing Sheets

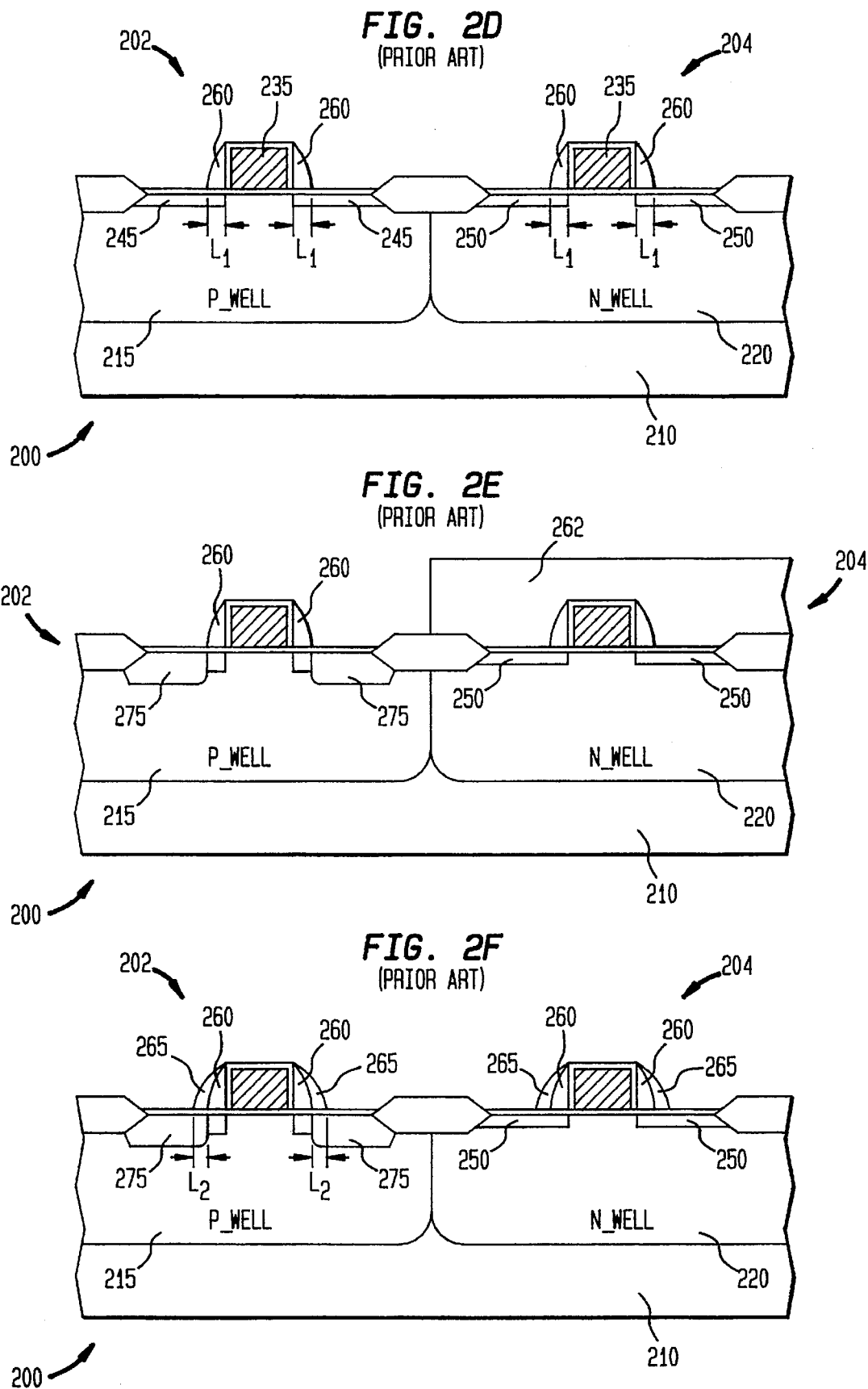

METHOD FOR MAKING A VARIABLE LENGTH LDD SPACER STRUCTURE

FIELD OF THE INVENTION

The present invention is directed to method for fabricating a semiconductor device. In particular, the present invention is directed to forming a semiconductor device having a variable length LDD (lightly doped drain) spacer structure.

BACKGROUND OF THE INVENTION

Lightly doped drain (LDD) structures are implemented in the substrate of NMOSFET and PMOSFET devices to reduce the MOSFET's short channel effect (SCE), hot carrier effect (HCE) and gate induced drain leakage (GIDL). A spacer is used to allow formation of a desired length of the LDD region below the spacer.

The LDD spacer length requirement for NMOSFET and PMOSFET devices are different. For NMOS devices, the LDD spacer length should be as short as possible to reduce the series resistance of the LDD region. This provides for optimum HCE, SCE and GIDL effects for an NMOS device.

PMOS devices have a larger lateral diffusion from the $P^+$ source/drain regions than the lateral diffusion of $N^+$ source/drain regions of NMOS devices. To counteract this larger lateral diffusion and to reduce the SCE, HCE, and GIDL effects in a PMOS device, the length of the LDD region of the PMOS device is preferably larger than that of the NMOS device. Therefore, using a similar length LDD spacer for both NMOS and PMOS devices does not result in an optimum reduction of the SCE, HCE, and GIDL effects for both the NMOS and PMOS devices.

FIGS. 1(A)–1(E) illustrate a first prior art process for making a semiconductor device having an LDD structure. This first prior art process uses only one type of spacer for a semiconductor structure 100 having an NMOS device 102 and a PMOS device 104 formed in a substrate 110. The substrate 110 may be N-type or P-type. In step (A) shown in FIG. 1(A), a P-well 115 and an N-well 120 are formed in the substrate 110. A thin gate oxide layer 125 is formed on the wells 115, 120 by thermal oxidation of the surface of the wells 115, 120. Thicker field oxide regions 130 are used to separate adjacent devices. One of the field oxide regions 130 is formed at the boundary of the P-well 115 and the N-well 120. The polysilicon gates 135 are formed on the gate oxide 125.

In step (B) shown in FIG. 1(B), a polysilicon oxide 140 is formed over the polysilicon gates 135. N-type impurities are implanted in the P-well 115 to form $N^-$ regions 145. Similarly, P-type impurities are implanted in the N-well 120 to form $P^-$ regions 150. The regions 145, 150 are formed between the field oxide regions 130 and the polysilicon oxide layer 140 covering the polysilicon gates 135.

In step (C) shown in FIG. 1(C), an oxide or a nitride layer 155 is deposited on the entire semiconductor structure 100 covering the gates 135 of the NMOS and PMOS devices 102, 104.

In step (D) shown in FIG. 1(D), anisotropic etching of the oxide or nitride layer 155 (shown in FIG. 1(C)) is performed to form oxide or nitride spacers 160 of a desired length L on the side walls of the gates 135.

In step (E) shown in FIG. 1(E), N-type impurities are implanted in the P-well 115 only by first masking the PMOS device 104 with a photoresist layer (not shown). The implanted N-type impurities form $N^+$ source/drain regions 175 in a portion of the $N^+$ regions 145 (see FIG. 1(D)). Similarly, P-type impurities are implanted only in the N-well 120 after removing the photoresist layer covering the PMOS device 104 and masking the NMOS device 102 with another photoresist layer (not shown). The implanted P-type impurities form $P^+$ source/drain regions 180 in a portion of the $P^-$ regions 150 (see FIG. 1(D)). The source/drain regions 175, 180 are formed between the field oxide regions 130 and the edge of the spacers 160 farthest away from the gates 135.

The portions of the $N^-$ and $P^-$ regions 145, 150 (shown in FIG. 1(D)) remaining below the spacers 160 are the LDD regions 185, 190 of the NMOS and PMOS devices 102, 104 respectively. The LDD regions 185, 190 are defined by the length L of the spacer 160. Therefore, the N-LDD and P-LDD regions 185, 190 have the same length which equals to the length L of the spacer 160.

Finally, conventional back end processes are performed such as an interlayer-dielectric (ILD) deposition, ILD planarization, contact opening, metal deposition, metal pattern definition and passivation.

This conventional LDD process only uses one kind of spacer 160 having the same length L. Thus, the LDD regions 185, 190 of both the NMOS and PMOS devices 102, 104 have the same length L. Because of differing optimal LDD region lengths for NMOS and PMOS devices, the NMOS and PMOS devices 102, 104 preferably should not both have LDD regions of the same length. Thus, the semiconductor structure 100 formed with this process cannot have an optimal length for both the N-LDD 185 and an P-LDD 190 regions. Therefore, the semiconductor structure 100 formed with this process cannot have NMOS and PMOS devices 102, 104 which are both optimized for device characteristics.

To optimize both the NMOS and PMOS characteristics, different LDD spacer lengths are required. There are two conventional ways to optimize the characteristics of both NMOS and PMOS devices of a semiconductor. One method is described in U.S. Pat. No. 5,278,441 (Kang) and U.S. Pat. No. 5,254,866 (Ogoh).

FIGS. 2(A)–2(G) illustrate a second prior art process that uses two spacers for a semiconductor structure 200 having an NMOS 202 device and a PMOS 204 device. The initial steps in the formation of the semiconductor structure 200 are identical to steps (A) to (D) of FIGS. 1(A)–1(D). FIG. 2(D) shows a first spacer 260 formed around polysilicon gates 235. The first spacer 260 is analogous to the spacer 160 of FIG. 1(D) and is formed using steps similar to steps (A) to (D) of FIGS. 1(A)–1(D).

In step (A) shown in FIG. 2(A), a P-well 215 and an N-well 220 are formed in a substrate 210 which may be N-type or P-type. A thin gate oxide layer 225 is formed on the wells 215, 220 by thermal oxidation of the surface of the wells 215, 220. Thicker field oxide regions 230 are used to separate adjacent devices. One of the field oxide regions 230 is formed at the boundary of the P-well 215 and the N-well 220. The polysilicon gates 235 are formed on the gate oxide 225.

In step (B) shown in FIG. 2(B), a polysilicon oxide 240 is formed over the polysilicon gates 235. N-type impurities are implanted in the P-well 215 to form $N^-$ regions 245. Similarly, P-type impurities are implanted in the N-well 220 to form $P^-$ regions 250. The regions 245, 250 are formed between the field oxide regions 230 and the polysilicon oxide layer 240 covering the polysilicon gates 235.

In step (C) shown in FIG. 2(C), an oxide or a nitride layer 255 is deposited on the entire semiconductor structure 200 covering the gates 235 of the NMOS and PMOS devices 202, 204.

In step (D) shown in FIG. 2(D), anisotropic etching of the oxide or nitride layer 255 (shown in FIG. 2(C)) is performed to form oxide or nitride spacers 260 of a desired length L on the side walls of the gates 235.

In step (E) shown in FIG. 2(E), N-type impurities are implanted in the P-well 215 only by first masking the PMOS device 204 with a photoresist layer 262. The implanted impurities form $N^+$ source/drain regions 275 in a portion of the $N^-$ regions 245 (shown in FIG. 2(D)).

In step (F) shown in FIG. 2(F), after removing the photoresist layer 262 covering the PMOS device 204, a second spacer 265 is formed in a similar fashion as the first spacer 260. That is, a second oxide or a nitride layer (not shown) is deposited on the entire semiconductor structure 200, including the first spacers 260. This second layer is anisotropically etched to form the second spacers 265 of a desired length $L_2$ on the first spacers 260.

In step (G) shown in FIG. 2(G), P-type impurities are implanted in the N-well 220 only by first masking the NMOS device 202 by a photoresist layer 277. The implanted impurities form $P^+$ source/drain regions 280 in a portion of the $P^-$ regions 250 (shown in FIG. 2(F)). The effective spacer length $L_{eff}$ during the formation of the P+source/drain regions 280 for the PMOS 204, equals the length $L_1$ of the first spacer 260 plus the length $L_2$ of second spacer 265; i.e., $L_{eff}=L_1+L_2$.

The portions of the $N^-$ regions 245 (shown in FIG. 2(D)) remaining below the spacers 260 are the N-LDD regions 285 of the NMOS device 202. The portions of the $P^-$ regions 250 (shown in FIG. 2(D)) remaining below the spacers 260, 265 are the P-LDD regions 290 of the PMOS devices 204. The LDD regions 285, 290 are defined by the lengths of the spacers 360, 365. Therefore, the length of the N-LDD regions 285 are nearly equal to the length $L_1$ of the spacer 260, and the length of the P-LDD regions 290 equals to the combined length $L_{eff}$ of the two spacers 260, 265.

Finally, the photoresist layer 277 is removed and back end process steps similar to the back end steps described in connection with FIGS. 1(A)–1(E) are performed.

In this fashion, the spacers used for forming the $P^+$ source/drain regions 280 of the PMOS device 204 have a length $L_{eff}$ which is longer than the length $L_1$ of the first spacer 260 used for forming $N^+$ source/drain regions 275 of the NMOS device 202. These lengths $L_1$ and $L_{eff}$ can be chosen independently to form the LDD regions 285, 290 with desired lengths which are independent of each other. Thus, the characteristics of both the NMOS and PMOS devices 202, 204 of the semiconductor structure 200 can be optimized.

However, this method has many disadvantages. It requires an additional LDD spacer formation step thus requiring two anisotropic etching steps. For oxide spacers, the two anisotropic etching steps will substantially reduce the thickness of the field oxide regions 320. This results in a reduced field isolation. Furthermore, the two anisotropic etching steps will substantially etch away the edges of the field oxide regions 230. This induces junction leakage at the edges of the field oxide regions 230.

A second conventional method for optimizing the NMOS and PMOS characteristics of a semiconductor is disclosed in U.S. Pat. No. 5,270,233 (Hamatake) and U.S. Pat. No. 5,134,085 (Gilgen). As shown in FIGS. 3(A)–(E), in this second conventional method, the NMOS and PMOS devices 302, 304 of a semiconductor structure 300 are formed sequentially. That is, after completely forming one device (e.g., the NMOS device 302), the other device (e.g., the PMOS device 304) is formed.

In step (A) shown in FIG. 3(A), a P-well 315 and an N-well 320 are formed in a substrate 310 which may be N-type or P-type. A thin gate oxide layer 325 is formed on the wells 315, 320 by thermal oxidation of the surface of the wells 315, 320. Thicker field oxide regions 330 are used to separate a adjacent devices. One of the field oxide regions 330 is formed at the boundary of the P-well 215 and the N-well 220. The polysilicon gates 335 are formed on the gate oxide 325. Then, a polysilicon oxide 336 is formed over the polysilicon gates 335.

In step (B) shown in FIG. 3(B), using, for example, a photoresist layer 337 as a mask to cover the PMOS device 304, N-type impurities are implanted in the P-well 315 to form $N^-$ regions 345. Then an oxide layer 340 is formed over the polysilicon gate 335 of the NMOS device 302. In Hamatake, silicon dioxide is formed over the gate 335 of the NMOS device 302 using a liquid phase deposition (LPD) method. Because there is the photoresist layer 337 covering the PMOS device 304, the oxide layer 340 is not formed over the PMOS device 304.

In step (C) shown in FIG. 3(C), spacers 360 of a desired length $L_1$ are formed on the side walls of the gate 335 of the NMOS 302. The spacers 360 are formed from the oxide layer 340 in a similar fashion as the spacers 360 of FIG. 2(D).

In step (D) shown in FIG. 3(D), N-type impurities are implanted in the P-well 315. The implanted impurities form $N^+$ source/drain regions 375 in a portion of the $N^-$ regions 345 (shown in FIG. 3(C)).

In step (E) shown in FIG. 3(E), the photoresist layer 337 from the PMOS device 304 is removed and steps similar to steps FIGS. 3(B) to 3(D) are repeated. That is, the NMOS device 302 is covered with a photoresist layer 377; P-type impurities are implanted in the N-well 320 to form $P^-$ regions (not shown) which are similar to the $N^-$ regions 345 shown in FIG. 3(B); an oxide layer (not shown), which is similar to the oxide layer 340 shown in FIG. 3(B), is formed over the polysilicon gate 335 of the PMOS device 304; spacers 365 of a desired length $L_2$ are formed on the side walls of the gates 335 from the oxide layer (not shown); and P-type impurities are implanted in the N-well 320 to form $P^+$ source/drain regions 380 in a portion of the $P^-$ regions (not shown). Finally, the photoresist layer 377 is removed and similar back end processes are performed as the previous methods.

As shown in FIG. 3(E), the portions of the $N^-$ regions 345 (shown in FIG. 3(C)) remaining below the spacers 360 are the N-LDD regions 385 of the NMOS device 302. The portions of the $P^-$ regions (not shown) remaining below the spacers 360, 365 are the P-LDD regions 390 of the PMOS devices 304. The lengths $L_1$, $L_2$ of the LDD regions 385, 390 are nearly equal to the lengths of the spacers 360, 365 respectively. That is, the LDD regions 385, 390 are defined by the lengths of the spacers 360, 365 respectively.

Although this process allows formation of LDD regions 385, 390 that have independently determined lengths $L_1$ and $L_2$, this process has many disadvantages. This process is complex and requires an additional spacer deposition and etching. Furthermore, the NMOS and PMOS devices 302, 304 must be separately formed, e.g., sequentially. In addition, the process disclosed by Hamatake, requires the spacer oxide layer to be grown over the gate 335 of the NMOS device 302 and the PMOS device 304 using an LPD method.

It is therefore an object of the present invention to overcome the disadvantages of the prior art.

It is another object of the present invention to make a semiconductor integrated circuit structure having a variable length LDD spacer structure using a simple method.

It is yet another object of the present invention to make a semiconductor integrated circuit structure having a variable length LDD spacer structure by oxidizing polysilicon spacers to increase their size.

SUMMARY OF THE INVENTION

This and other objects are achieved by the present invention. According to an illustrative embodiment, a first insulation layer (e.g., a gate oxide layer) is formed on a semiconductor structure having a P-well and an N-well provided in a substrate. A first and a second gate are formed on the P-well and N-well respectively wherein the gate oxide layer is interposed between the wells and the gates. A second insulation layer is formed over the first and second gates. Illustratively, the gates are polysilicon or polycide gates and the second insulation layer is polyoxide.

N-type impurity ions are selectively implanted to form lightly doped N-type diffusion regions in the P-well on either side of the first gate. Similarly, P-type impurity ions are selectively implanted to form lightly doped P-type diffusion regions in the N-well on either side of the second gate.

A spacer is formed on both side walls of each of the gates. Illustratively, the spacers are polysilicon spacers. Each spacer covers a portion of the lightly doped N-type and P-type diffusion regions. N-type impurity ions are selectively implanted in a portion of the lightly doped N-type diffusion regions not covered by the spacers. This forms $N^+$-type source and drain regions in the P-well adjacent to the lightly doped N-type diffusion regions which have a final length equaling the length of the spacers. The selective implantation is accomplished, for example, by depositing a photoresist mask layer on the N-well region to prevent N-type ion implantation therein. The photoresist mask layer on the N-well is then removed. Next, the spacers are oxidized or nitridized which enlarges the spacers. P-type impurity ions are selectively implanted in a portion of the lightly doped P-type diffusion regions not covered by the enlarged spacers. This forms $P^+$-type source and drain regions in the N-well adjacent to the lightly doped P-type diffusion regions which have a final length equaling the length of the enlarged spacers. The selective implantation is accomplished by depositing a photoresist mask layer on the P-well region to prevent P-type ion implantation therein.

Because the oxidation or nitridization step, performed after source/drain formation in the P-well, enlarges the spacers, the final P-type LDD regions in the N-well have a longer length than the final N-type LDD regions in the P-well. Thus, the length of the LDD regions in the wells can be adjusted to yield a semiconductor having both an NMOS and a PMOS of optimal characteristics.

The inventive method for making a variable length LDD spacer structure is simple, resulting in lower junction leakage and lower sheet resistance of the source/drain regions. Furthermore, the spacer enlarging oxidation or nitridization step activates the N-type ions of the source/drain regions in the P-well. The spacer enlarging oxidation or nitridization step may also increase the thickness of the oxide or nitride layer above the source/drain regions of the N-well. The thickened oxide or nitride layer reduces the P-type ion penetration during implantation and formation of the source/drain regions in the N-well. This results in a shallow P-type ion implant junction which is desirable.

BRIEF DESCRIPTION OF THE DRAWINGS

FIGS. 2(A)–(G) show a second conventional variable length LDD spacer structure fabrication process.

DETAILED DESCRIPTION OF THE INVENTION

Figure 1A:
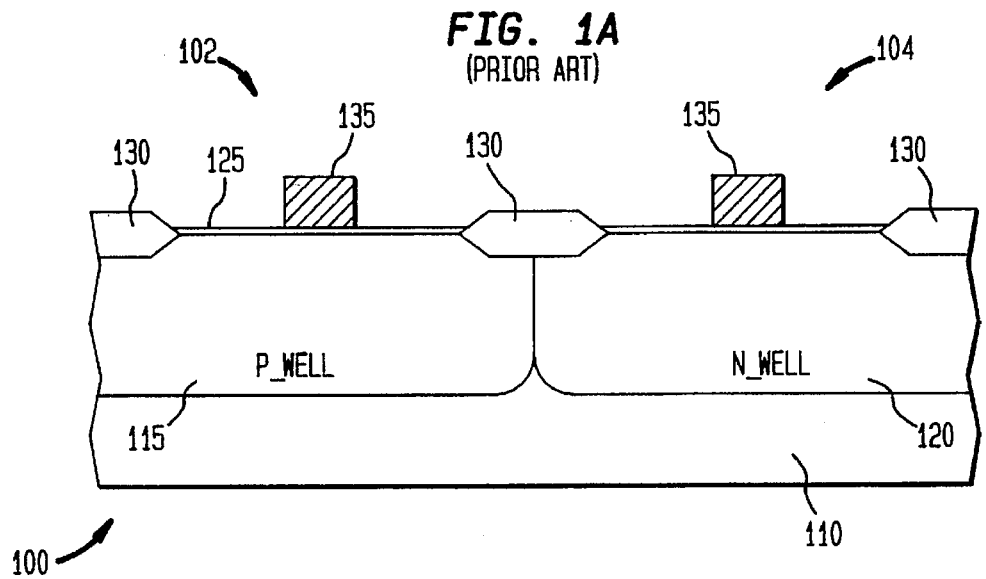
FIGS. 1(A)–(E) show a first conventional fixed length LDD spacer structure fabrication process.
Figure 1B:
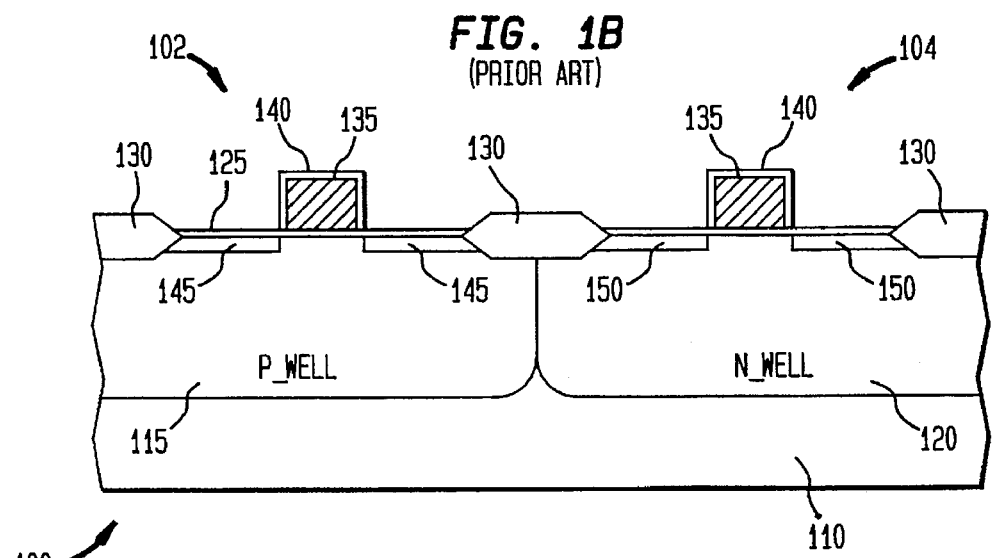
Figure 1C:
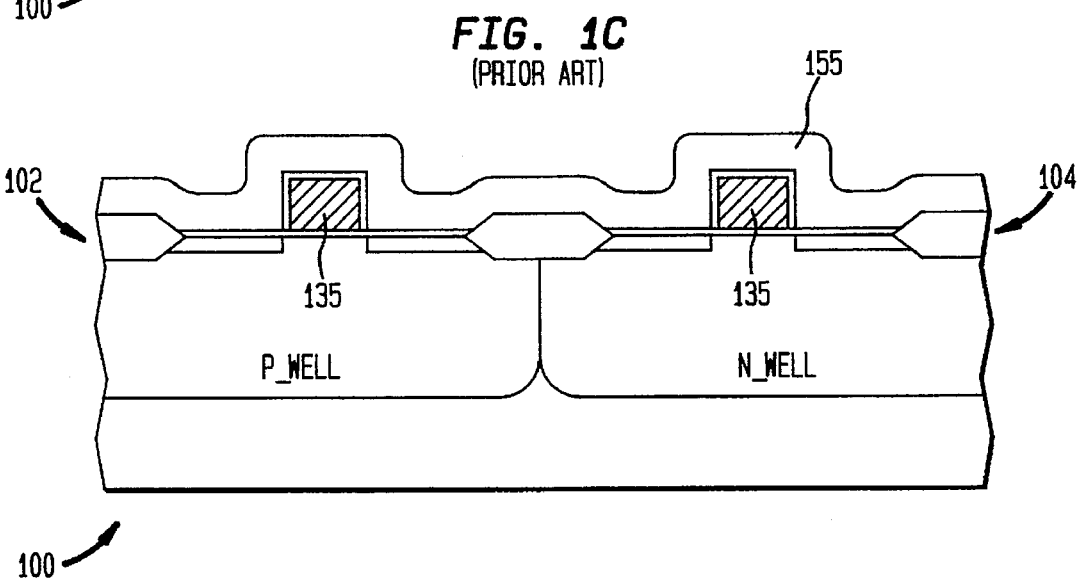
Figure 1D:
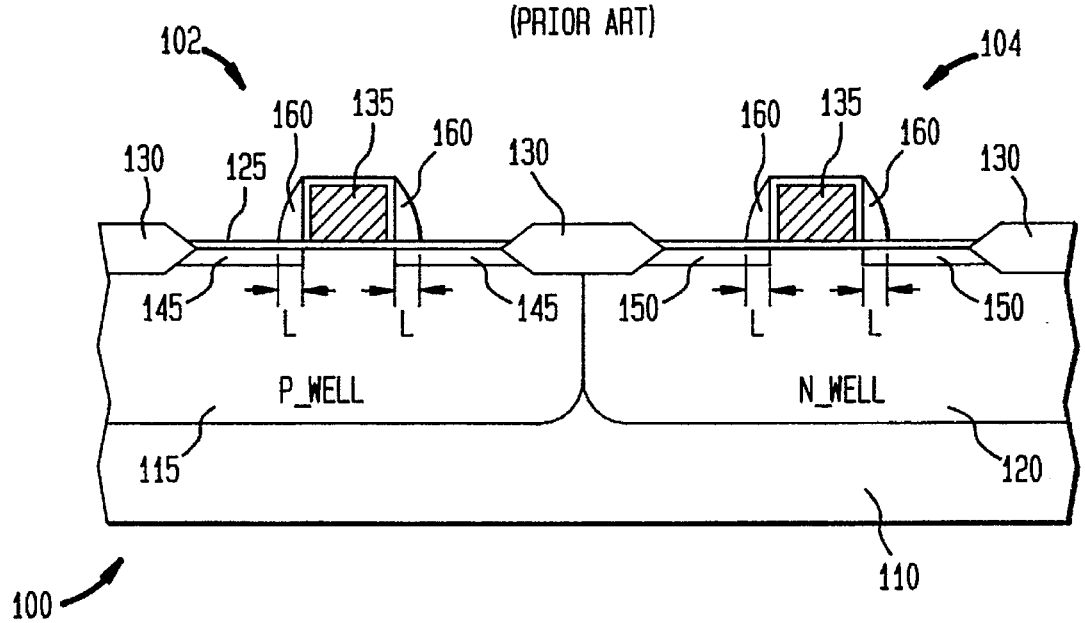
Figure 1E:
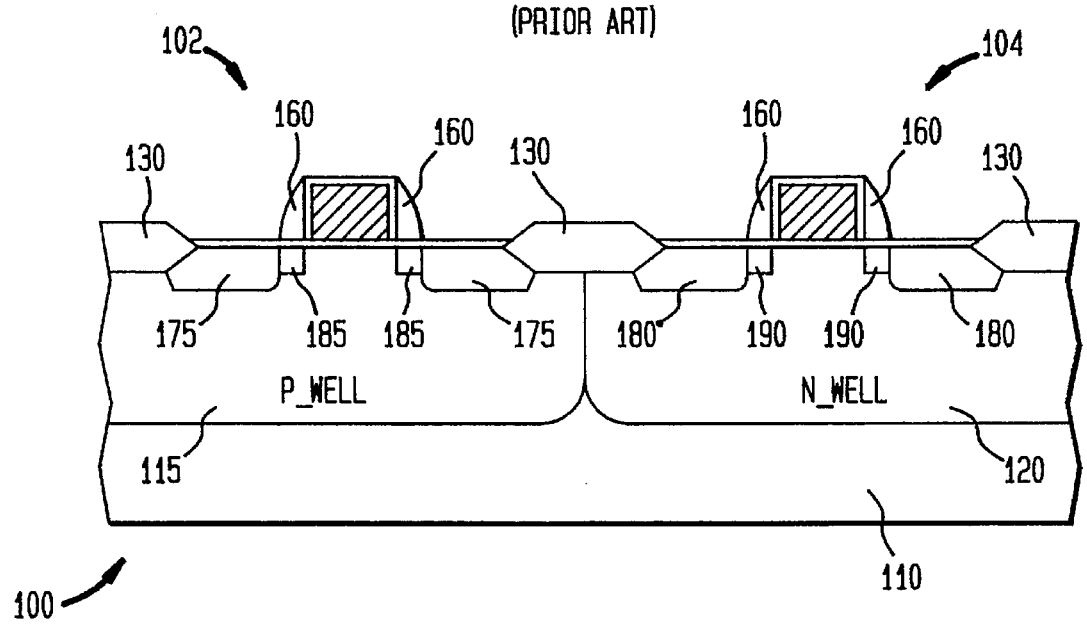
Figure 2A:
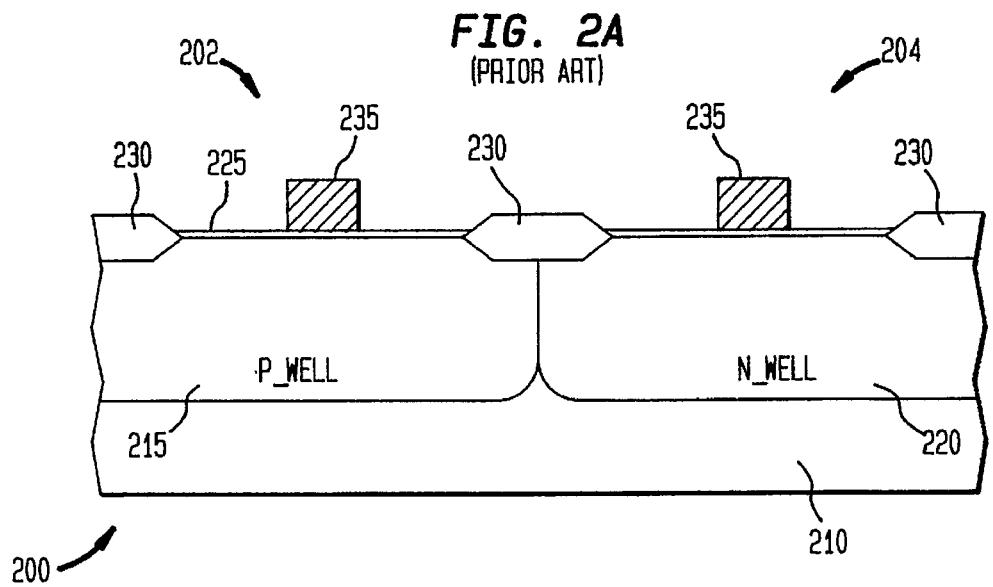
Figure 2B:
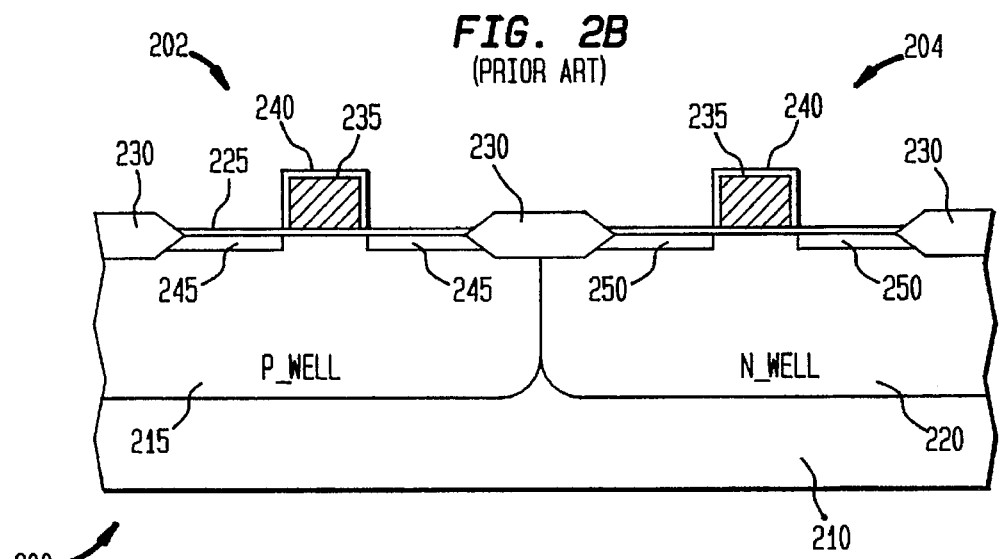
Figure 2C:
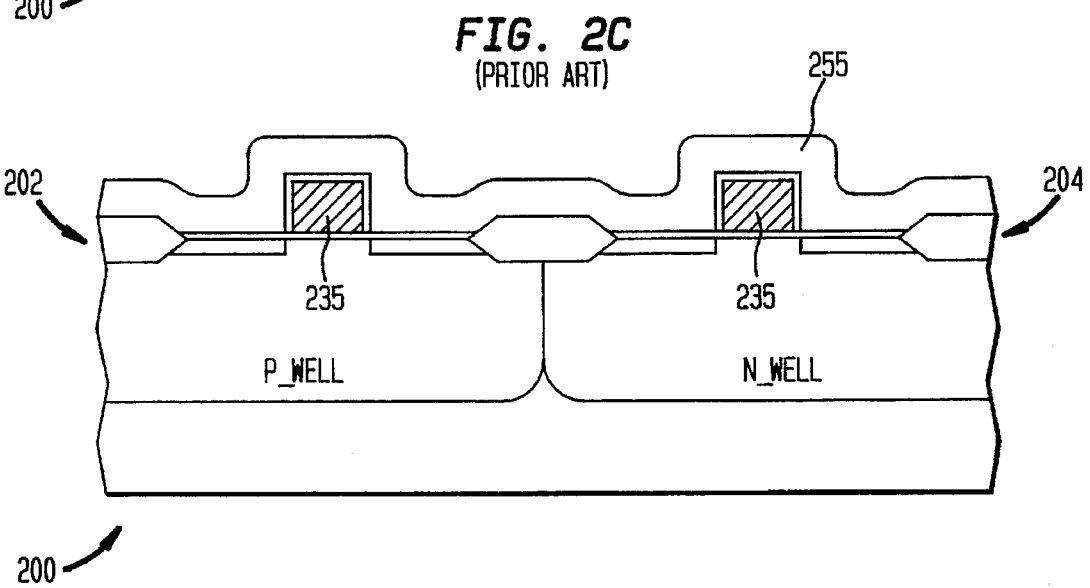
Figure 2G:
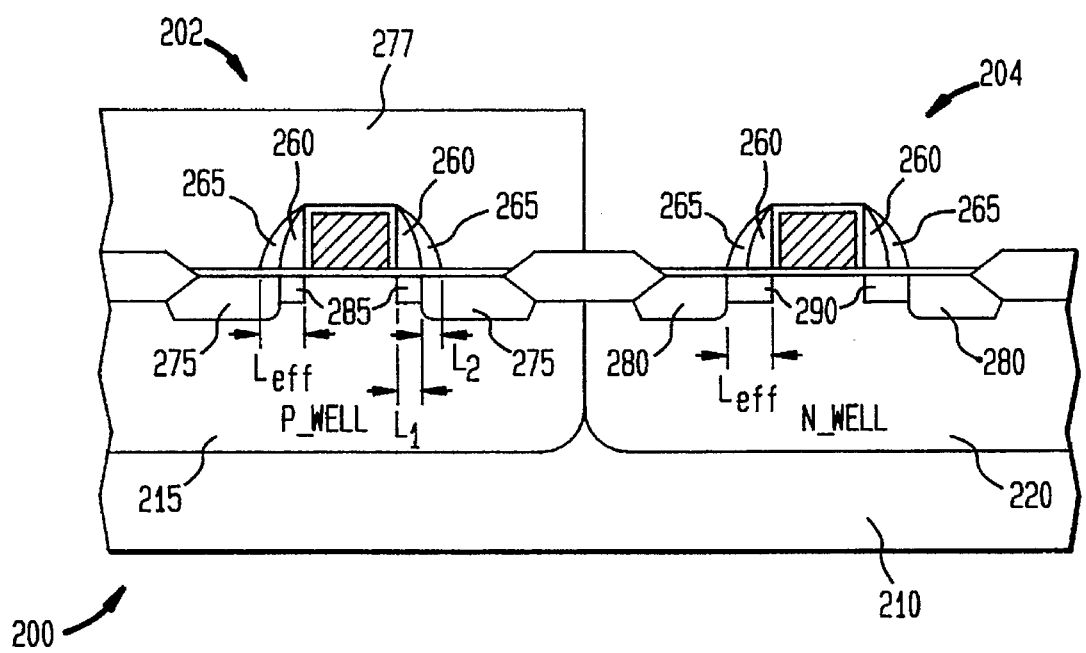
Figure 3A:
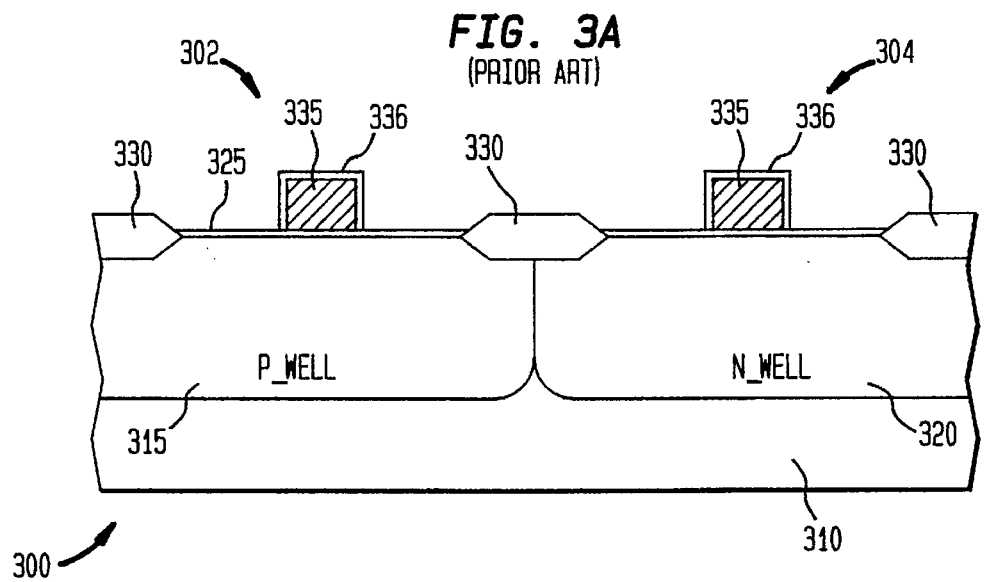
FIGS. 3(A)–(E) show a third conventional variable length LDD spacer structure fabrication process.
Figure 3B:
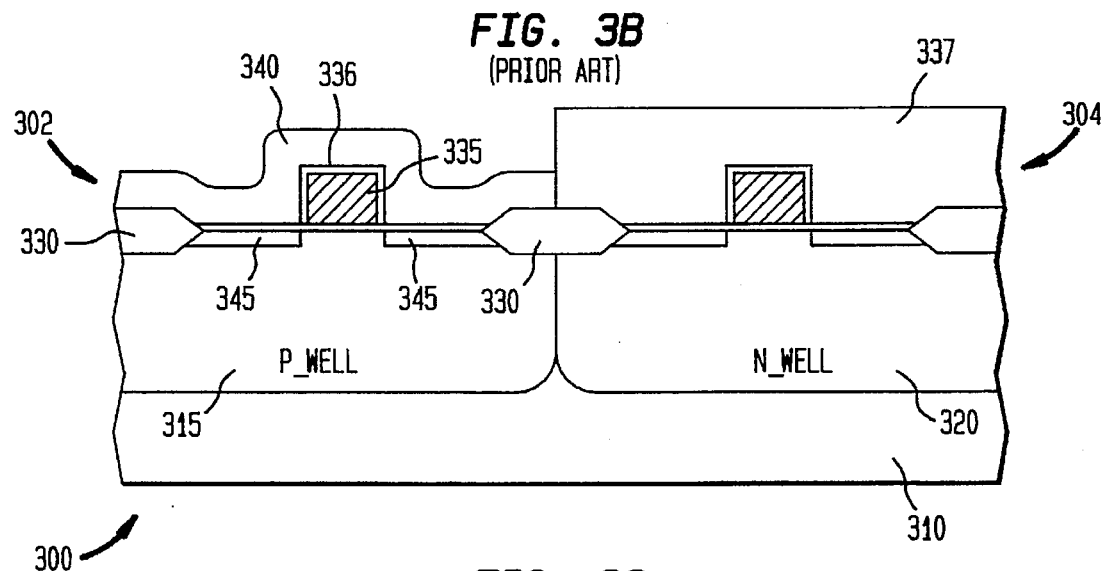
Figure 3C:
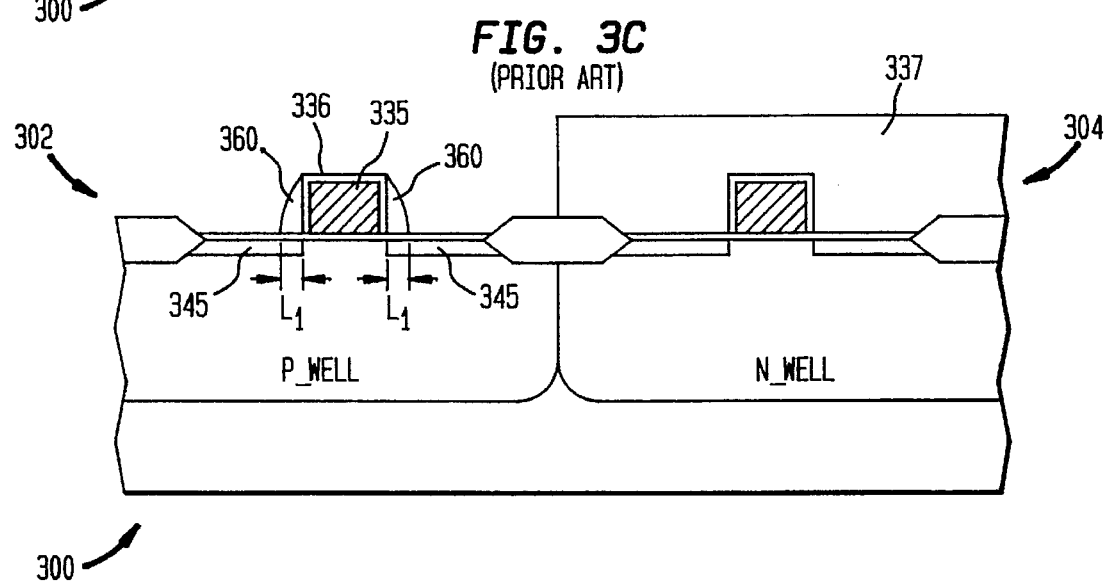
Figure 3D:
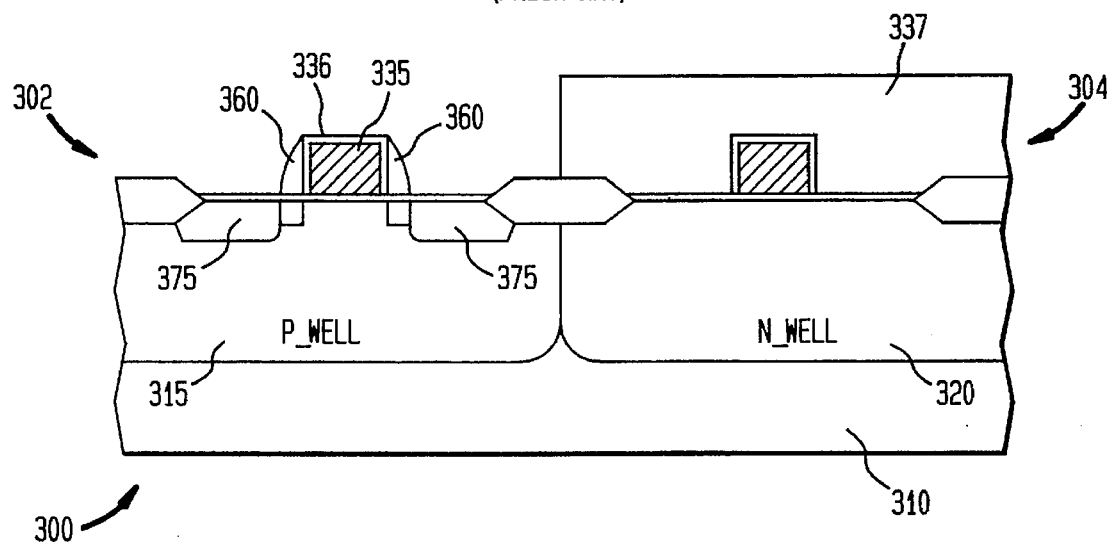
Figure 3E:
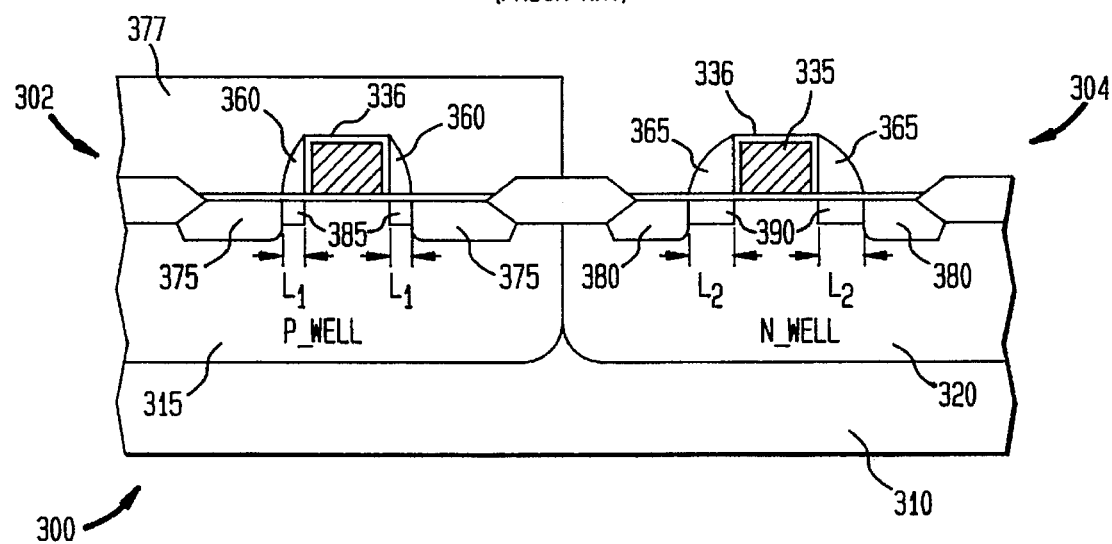
Figure 4A:
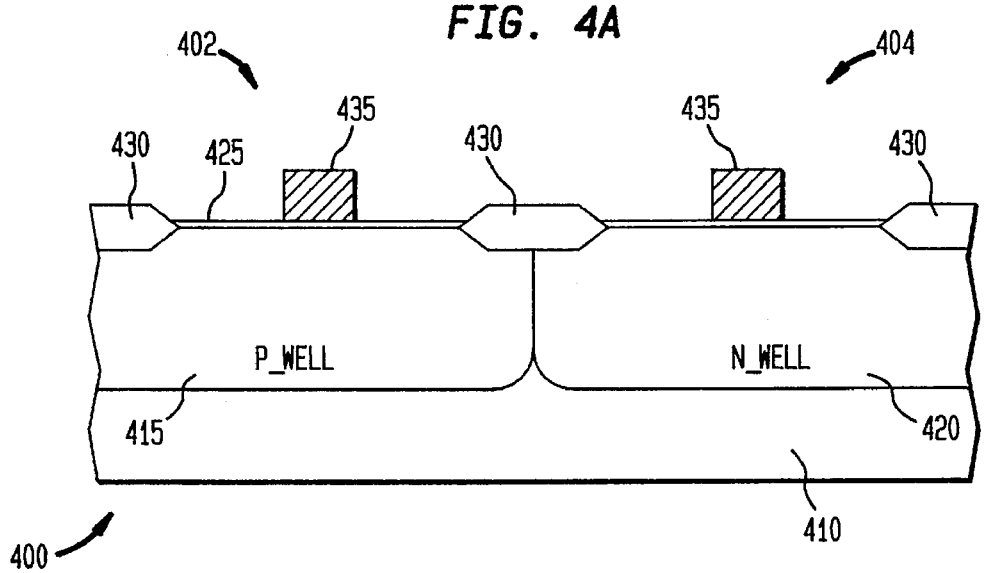
FIGS. 4(A)–(G) show a variable length LDD spacer structure fabrication process according to the present invention.

A semiconductor integrated circuit structure 400 having an NMOS device 402 and a PMOS 404 device with variable length LDD spacer structure in accordance with an illustrative embodiment of the invention is formed as follows:

1. In step (A) shown in FIG. 4(A), a P-well 415 and an N-well 420 are formed in a substrate 410 which may be N-type or P-type. A thin gate oxide 425, having a thickness of approximately 50 Å~200 Å, is formed on the wells 415, 420. Field oxide regions 430 are formed by selective oxidation in the boundary region of the wells 415, 420 to separate the adjacent NMOS and PMOS devices 402, 404. The thickness of the field oxide regions 430 is approximately 4000 Å~6000 Å. A polysilicon or polycide gate 435 is formed on the wells 415, 420.

Figure 4B:
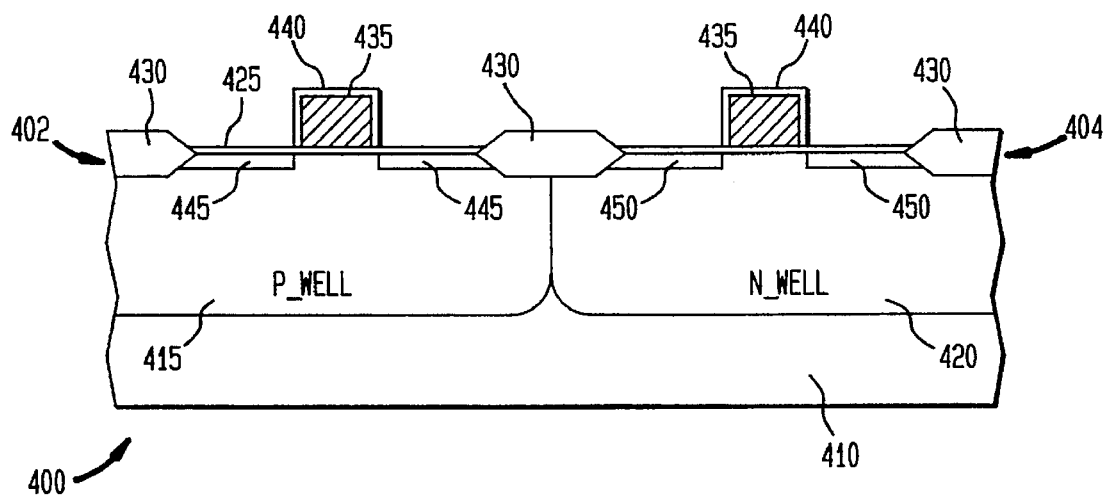

2. In step (B) shown in FIG. 4(B), a polysilicon oxide 440 is formed by thermal oxidation over the polysilicon gates 435. The thickness of the polysilicon oxide 440 is approximately 50 Å~300 Å. The PMOS device 404 is covered with a first photoresist mask layer (not shown) and N-type impurities are implanted in the P-well 41-5 to form $N^-$ LDD regions 445. Thereafter, the first photoresist mask layer (not shown) covering the PMOS device 404 is removed and the NMOS device 402 is covered with a second photoresist mask layer (not shown). Next, P-type impurities are implanted in the N-well 420 to form $P^-$ LDD regions 450. The N-type and P-type impurities are implanted at the dose of $1 \times 10^{13}$~$1 \times 10^{14}$ ions/cm² with an energy of 30~80 KeV. The regions 445, 450 are formed between the field oxide regions 430 and the polysilicon oxide layer 440 covering the polysilicon gates 435.

Figure 4C:
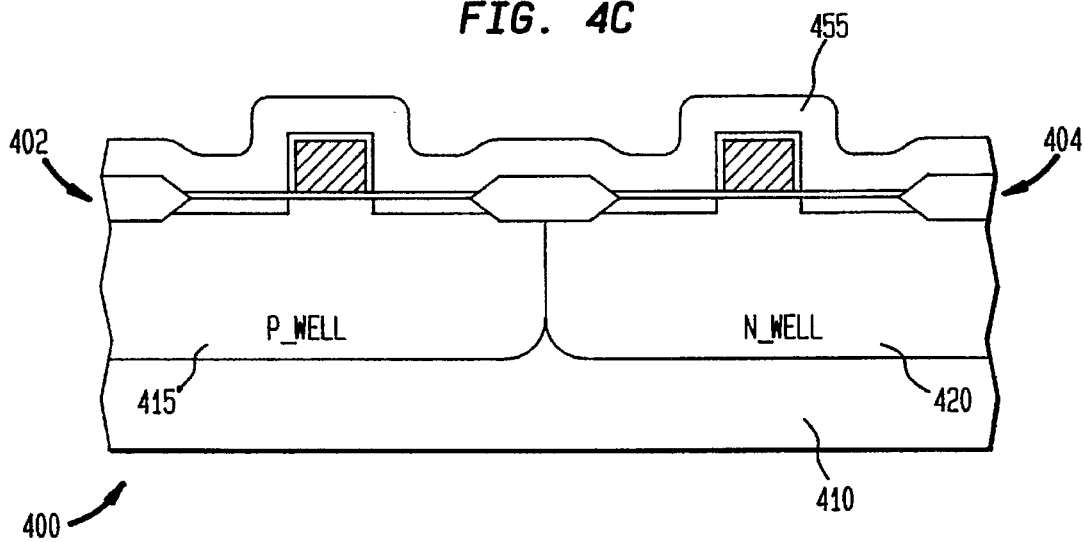

3. In step (C) shown in FIG. 4(C), a polysilicon layer 455 of thickness 1000 Å~3000 Å is deposited on the entire structure 400 using a LPCVD (low pressure chemical vapor deposition) process.

Figure 4D:
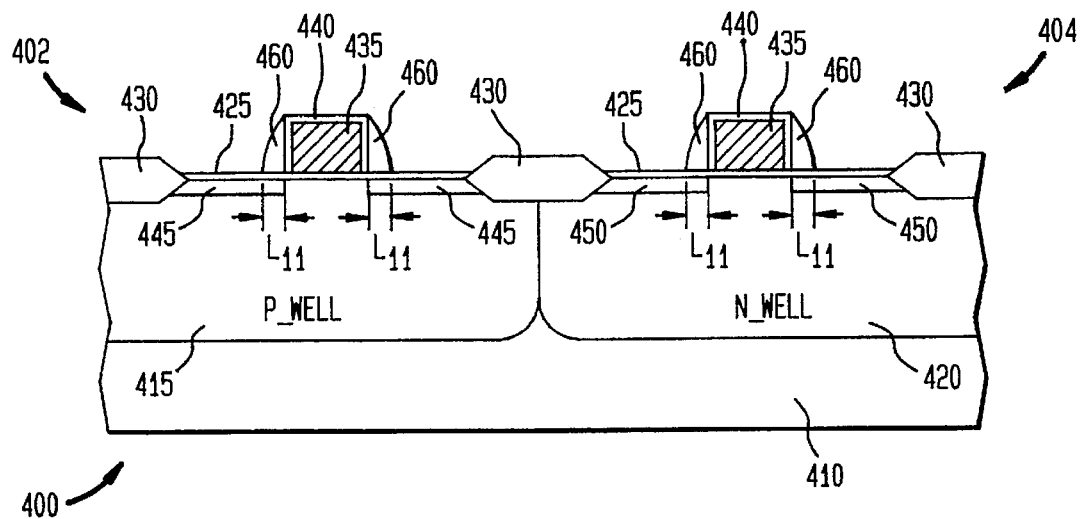

4. In step (D) shown in FIG. 4(D), the polysilicon layer 455 (shown in FIG. 4(C)) is anisotropically etched to form polysilicon spacers 460 of a desired length $L_{11}$ on the side walls of the polysilicon gates 435. The polysilicon spacers 460 are separated from the polysilicon gates 435 by the polyoxide layer 440. Because there is a high silicon to silicon oxide etching selectivity during etching of the polysilicon layer 455 to form the polysilicon spacer 460, there is virtually no etching of the oxide layer 440. Similarly, the thickness of the field oxide regions 430 is not reduced during etching of the silicon layer 455. Because the edges of the field oxide regions 430 are not etched away, there is no induced junction leakage along the field oxide edges.

Figure 4E:
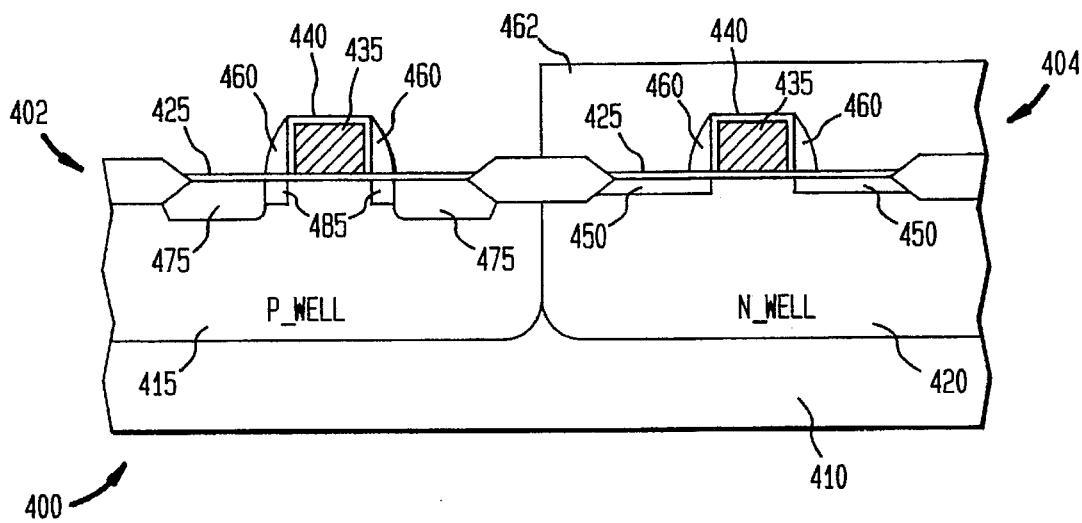

5. In step (E) shown in FIG. 4(E), N-type impurities are implanted only in the N-LDD regions 445 located in the P-well 415 by first masking the PMOS device 404 with a photoresist layer 462. The implanted impurities form $N^+$ source/drain regions 475 in a portion of the N-LDD $N^-$ regions 445. The N-type impurities are implanted at the dose of $1\times10^{15}$~$6\times10^{15}$ ions/cm$^2$ with an energy of 30~90 KeV. The portions of the N$^-$ regions 445 (shown in FIG. 4(D)) remaining below the spacers 460 are the N-LDD regions 485 of the NMOS device 402. The N-LDD regions 485 have a length which is nearly equal to the length $L_{11}$ of the polysilicon spacer 460. The length $L_{11}$ of the polysilicon spacer 460 can be optimized to yield optimum NMOS characteristics.

Figure 4F:
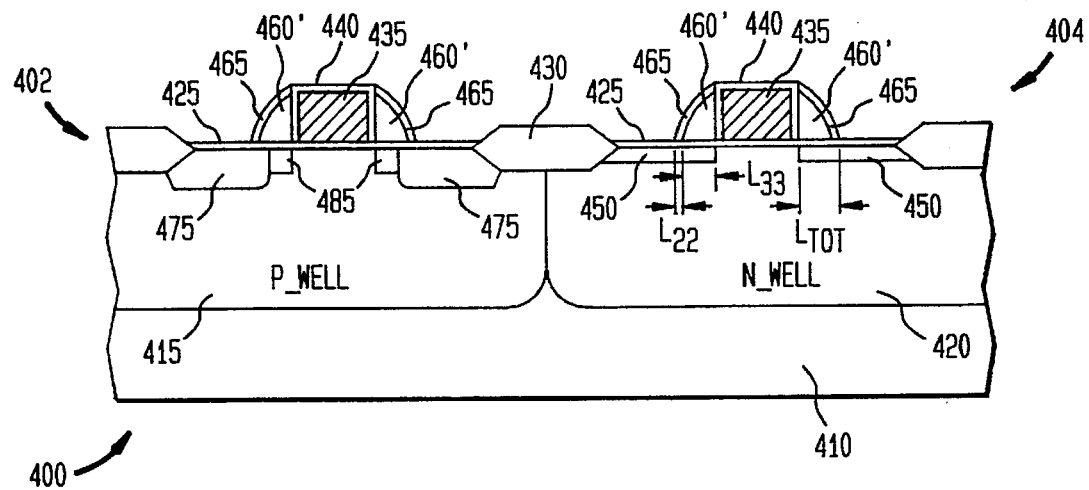

6. In step (F) shown in FIG. 4(F), the photoresist layer 462 is removed and the polysilicon spacers 460 are oxidized. Polysilicon oxides have about twice more volume than polysilicon. Therefore, the oxidation of the polysilicon spacers 460 can be controlled to yield a polysilicon oxide spacer 465 having a length $L_{22}$. The combined or total length $L_{TOT}$ of the unreacted polysilicon spacer 460' and the polysilicon oxide spacer 465 could be as large as twice the length $L_{11}$ of the polysilicon spacer 460.

Alternatively, in step (F), instead of oxidizing the polysilicon spacers 460 to form the polysilicon oxide spacer 465, the polysilicon spacers 460 are thermally nitridized using NH$_4$OH to form polysilicon Si$_3$N$_4$ nitride spacers (not shown). The polysilicon nitride spacers (not shown) are formed on the surface of the polysilicon spacers 460. The polysilicon nitride spacers are similar to the polysilicon oxide spacers 465. Analogous to controlling the length $L_{22}$ of the polysilicon oxide spacers 465 by the oxidation step, a desired length $L_{22}'$ (not shown) of the polysilicon nitride spacers may be achieved by controlling the nitridization step. That is, the total length $L_{TOT}$ of the unreacted polysilicon spacer 460' and the polysilicon nitride spacer could be as large as approximately 1.3 times the length $L_{11}$ of the polysilicon spacer 460.

The P-LDD spacer length $L_{TOT}$ of the PMOS device 404 is equal to the sum of the length $L_{22}$ of the oxidized polysilicon spacer 465 (or the length $L_{22}'$ of the nitridized polysilicon spacer) and the length $L_{33}$ of the unreacted polysilicon spacer 460'. That is, $L_{TOT}=L_{22}+L_{33}$ (or $L_{TOT}=L_{22}'+L_{33}$). Therefore, the effective or total P-LDD spacer length $L_{TOT}$ of the PMOS 404 is longer than the N-LDD spacer length $L_{11}$ of the NMOS 402. In this fashion, the characteristics of both the NMOS and PMOS devices 402, 404 can be optimized.

Illustratively, the polysilicon oxidation or nitridization is controlled to yield a P-LDD spacer having a length $L_{TOT}$ of approximately 1.4 times the length $L_{11}$ of the polysilicon spacer 460. Thus, by controlling the degree of the polysilicon spacer oxidation or nitridization, the length $L_{22}$ (or $L_{22}'$) can be controlled and made to a desired length for optimum PMOS characteristics. For example, the length $L_{11}$ is 1000 Å, the length $L_{22}$ (or $L_{22}'$) is 660 Å, the length $L_{33}$ is 700 Å, and the length $L_{TOT}$ is 1360 Å.

The polysilicon spacer oxidation or nitridization step may also cause an increase in thickness of the polyoxide layer 440 covering the polysilicon or polycide gate 435 and the gate oxide layer 425 covering the source/drain areas. However, the polysilicon oxidation or nitridization rate is much higher than the oxidation or nitridization rate of a single crystal silicon. Therefore, the conditions of the spacer enlarging oxidation or nitridization step can be suitably adjusted to meet the P-LDD spacer length requirements and the oxide thickness requirements of the source/drain area.

In short, the spacer enlarging oxidation or nitridization step provides several advantages, namely, it provides an optimized P-LDD spacer length $L_{TOT}$ which results in an optimized characteristic of the PMOS device 404 formed after the optimized NMOS device 402. The spacer enlarging oxidation or nitridization step may increase the thickness of the oxide layers 425, 440. This reduces the penetration of the P$^+$ ions (into the gate 435 and the P$^+$ source/drain implantation region of the PMOS device 404) implanted during the P$^+$ source/drain implantation of the PMOS 404. Thus, the polysilicon gate sheet resistance of the P$^+$ implantation area will not increase greatly. Furthermore, the oxidation or nitridization step may activate the N$^+$ implanted ions in the source/drain areas of the NMOS device 402.

Figure 4G:
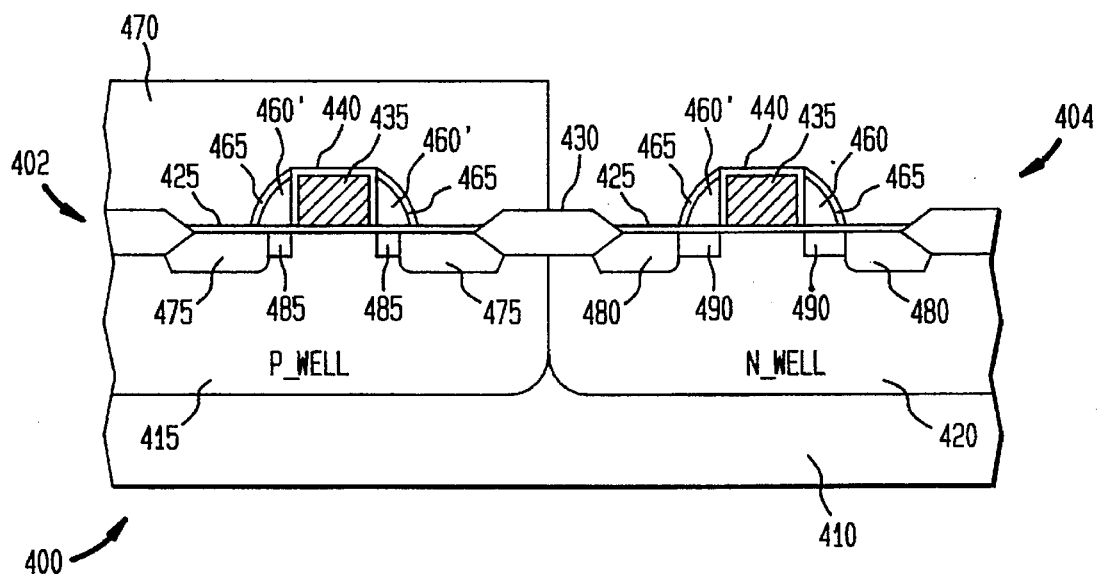

7. In step (G) shown in FIG. 4(G), P-type impurities are implanted only in the P-LDD regions 450 (shown in FIG. 4(F)) located in the N-well 420 by first masking the NMOS device 402 with a photoresist layer 470. The implanted impurities form P$^+$ source/drain regions 480 in a portion of the P-LDD P$^-$ regions 450. The P-type impurities are implanted at the dose of $1\times10^{15}$~$5\times10^{15}$ ions/cm$^2$ with an energy of 20~90 KeV. The portions of the P$^-$ regions 450 (shown in FIG. 4(F)) remaining below the spacers 460', 465 are the P-LDD regions 490 of the PMOS device 404. The P-LDD regions 490 have a length which is nearly equal to the length $L_{TOT}$, where $L_{TOT}$ is the combined length $L_{33}$ of the unreacted polisilicon spacer 460' and the length $L_{22}$ of the polysilicon oxide spacer 465 (or the length $L_{22}'$ of the polysilicon nitride spacer). The length $L_{TOT}$ can be optimized to yield optimum PMOS characteristics by controlling the oxidation or nitridization of the spacers 460 as discussed above in step (F).

The length of the LDD region 485 is nearly equal to the length $L_{11}$ of the spacer 460. In addition, the length of the LDD regions 490 is nearly equal to the total length $L_{TOT}$ of the oxidized (or nitridized) spacer 465 and the unreacted spacer 460', where $L_{TOT}=L_{22}+L_{33}$ (or $L_{TOT}=L_{22}'+L_{33}$), That is, the LDD region 485 is defined by the length $L_{11}$ of the spacer 460, while the LDD region 490 is defined by the total length $L_{TOT}$, where the total length $L_{TOT}$ is the sum of the length of the oxidized (or nitridized) spacer 465 $L_{22}$ ($L_{22}'$) and the length $L_{33}$ of the unreacted spacer 460'. Therefore, by independently controlling the lengths $L_{11}$ and $L_{22}$ of the spacers 460, 465, the lengths of the N-LDD and P-LDD regions 485, 490 are independently controlled. Thus, the NMOS and PMOS devices 402, 404 each has an optimal length LDD region resulting in optimal characteristics for each of the NMOS and PMOS devices 402, 404 of the semiconductor structure 400.

This invention has many advantages. The invention provides for forming a semiconductor structure having an NMOS and a PMOS device, each having a different length LDD spacer designed to form the NMOS and PMOS devices with optimum characteristics. The inventive method is simple and easily implemented. Etching of the polysilicon layer to form the polysilicon spacers will not substantially reduce the thickness of the oxide layer of the field oxide regions. Because the edges of the field oxide regions are not etched away during etching of the polysilicon layer, junction leakage at the edges of the field oxide regions is not induced.

The inventive method prevents an increase of the polysilicon sheet resistance in the P$^+$ source/drain implant regions of the PMOS device. The spacer enlarging oxidation or nitridization step may also activate the N$^+$ implanted ions in the N$^+$ source/drain implant regions of the NMOS device. Furthermore, the spacer enlarging oxidation or nitridization step may increase the thickness of the oxide layer above the P$^+$ source/drain implant regions of the PMOS device. This reduces the P$^+$ ion penetration into the substrate during the P$^+$ source/drain implant resulting in a desirable shallow P$^+$ implant junction.

In the Final steps, conventional back-end processes are performed. The back-end process steps are similar to the conventional back-end steps, such as, dielectric deposition, planarization, contact opening, metal deposition, metal pattern definition and passivation.

Finally, the above described embodiments of the invention are intended to be illustrative only. Numerous alternative embodiments may be devised by those skilled in the art without departing form the spirit and scope of the following claims.

I claim:

1. A method for fabricating a semiconductor device having a P-well and an N-well provided in a substrate, said method comprising the steps of:

(a) forming a first insulation layer on said substrate, (b) forming a first and a second gate on said P-well and N-well, respectively, with said first insulation layer interposed between said wells and said gates, (c) forming a second insulation layer over said first and second gates, (d) implanting impurity ions of an N-type on either side of said first gate so as to form lightly doped N-type diffusion regions in said P-well, (e) implanting impurity ions of a P-type on either side of said second gate so as to form lightly doped P-type diffusion regions in said N-well, (f) forming a spacer on both side walls of each of said gates so as to cover a portion of said lightly doped N-type and P-type diffusion regions, (g) implanting impurity ions of the N-type in a portion of said lightly doped N-type diffusion regions not covered by said spacers so as to form N-type source and drain regions, (h) oxidizing said spacers so as to enlarge said spacers, and (i) implanting impurity ions of the P-type in a portion of said lightly doped P-type diffusion regions not covered by said enlarged spacers so as to form P-type source and drain regions, wherein a final length of each of said lightly doped P-type diffusion regions is aligned with opposing side surfaces, as enlarged in said step of oxidizing, of said respective covering spacer.

2. The method of claim 1 further comprising the steps of:

after said step (f), depositing a photoresist layer on the N-well region, after said step (g), removing said photoresist layer on the N-well region, and after said step (h), depositing a photoresist layer on the P-well region.

3. The method of claim 1 wherein said first insulation layer is an oxide layer.

4. The method of claim 1 wherein said spacers and said gates are polysilicon.

5. The method of claim 1 wherein said spacers and said gates are polycide.

6. The method of claim 1 wherein a final length of said lightly doped N-type diffusion regions is approximately equal to a length of said spacers prior to said enlarging step.

7. The method of claim 1 wherein a final length of said lightly doped P-type diffusion regions is approximately equal to a length of said enlarged spacers.

8. A method for fabricating a semiconductor device having a PMOS device and an NMOS device which is adjacent to said PMOS device, said method comprising the steps of:

(a) implanting impurity ions of an N-type so as to form lightly doped N-type diffusion regions in a substrate of said NMOS device, (b) implanting impurity ions of a P-type so as to form lightly doped P-type diffusion regions in a substrate of said PMOS device, (c) forming a spacer on both side walls of a gate of said NMOS device and a gate of said PMOS device so as to cover a portion of said lightly doped N-type and P-type diffusion regions, (d) implanting impurity ions of the N-type in a portion of said lightly doped N-type diffusion regions not covered by said spacers so as to form N-type source and drain regions for said NMOS device, thereby forming N-LDD regions below said spacers, (e) oxidizing said spacers so as to enlarge said spacers, and (f) implanting impurity ions of the P-type in a portion of said lightly doped P-type diffusion regions not covered by said enlarged spacers so as to form P-type source and drain regions of said PMOS device, thereby forming P-LDD regions below said enlarged spacers wherein a final length of each of said lightly P-LDD regions is aligned with opposing side surfaces, as enlarged in said step of oxidizing, of said respective covering spacer.

9. A method for fabricating a semiconductor device having a PMOS device and an NMOS device, said method comprising the steps of:

(a) forming lightly doped drain regions in a substrate for said PMOS and said NMOS devices on either side of a gate of said PMOS device and on either side of a gate of said NMOS device, (b) forming a spacer on both side walls of said gates so as to cover a portion of said lightly doped drain regions, (c) forming source and drain regions for said NMOS device in a portion of said lightly doped drain regions which is not covered by said spacers of said NMOS device, (d) nitridizing said spacers so as to enlarge said spacers, and (e) forming source and drain regions for said PMOS device in a portion of said lightly doped drain regions which is not covered by said enlarged spacers of said PMOS device wherein a final length of each of said lightly doped drain regions of said PMOS device is aligned with opposing side surfaces, as enlarged in said step of nitridizing, of said respective covering spacer.

10. A method for fabricating a semiconductor device having a PMOS device and an NMOS device which is adjacent to said PMOS device, said method comprising the steps of:

(a) implanting impurity ions of an N-type so as to form lightly doped N-type diffusion regions in a substrate of said NMOS device, (b) implanting impurity ions of a P-type so as to form lightly doped P-type diffusion regions in a substrate of said PMOS device, (c) forming a spacer on both side walls of a gate of said NMOS device and a gate of said PMOS device so as to cover a portion of said lightly doped N-type and P-type diffusion regions, (d) implanting impurity ions of the N-type in a portion of said lightly doped N-type diffusion regions not covered by said spacers so as to form N-type source and drain regions for said NMOS device, thereby forming N-LDD regions below said spacers, (e) reacting said spacers with an agent so as to enlarge said spacers, and (f) implanting impurity ions of the P-type in a portion of said lightly doped P-type diffusion regions not covered by said enlarged spacers so as to form P-type source and drain regions of said PMOS device, thereby forming P-LDD regions below said enlarged spacers wherein a final length of each of said lightly doped P-type diffusion regions is aligned with opposing side surfaces, as enlarged in said step of reacting, said respective covering spacer.

11. A method for fabricating a semiconductor device having a PMOS device and an NMOS device, said method comprising the steps of:

(a) forming lightly doped drain regions in a substrate for said PMOS and said NMOS devices on either side of a gate of said PMOS device and on either side of a gate of said NMOS device, (b) forming a spacer on both side walls of said gates so as to cover a portion of said lightly doped drain regions, (c) forming source and drain regions for said NMOS device in a portion of said lightly doped drain regions which is not covered by said spacers of said NMOS device, (d) reacting said spacers with an agent so as to enlarge said spacers, and (e) forming source and drain regions for said PMOS device in a portion of said lightly doped drain regions which is not covered by said enlarged spacers of said PMOS device wherein a final length of each of said lightly doped drain regions of said PMOS device is aligned with opposing side surfaces, as enlarged in said step of reacting, of said respective covering spacer.

* * * * *